(12) United States Patent
Sato et al.

(10) Patent No.: US 8,106,437 B2
(45) Date of Patent: Jan. 31, 2012

(54) SEMICONDUCTOR STORAGE DEVICE

(75) Inventors: Hidenori Sato, Tokyo (JP); Hiroyasu Nousou, Tokyo (JP); Yoshitaka Fujiishi, Tokyo (JP); Hiroaki Sekikawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 11/311,165

(22) Filed: Dec. 20, 2005

(65) Prior Publication Data
US 2006/0138512 A1 Jun. 29, 2006

(30) Foreign Application Priority Data

Dec. 28, 2004 (JP) ................................. 2004-379735

(51) Int. Cl.
*H01L 27/108* (2006.01)
(52) U.S. Cl. ........................ 257/305; 257/300
(58) Field of Classification Search .......... 257/213–413, 257/E27.084; 438/142–308
See application file for complete search history.

(56) References Cited

U.S. PATENT DOCUMENTS

| | | | | |
|---|---|---|---|---|
| 4,939,104 A | * | 7/1990 | Pollack et al. ............. | 438/561 |
| 4,967,248 A | * | 10/1990 | Shimizu ................ | 257/304 |
| 5,237,528 A | * | 8/1993 | Sunami et al. ............ | 365/149 |
| 5,327,375 A | * | 7/1994 | Harari ..................... | 365/149 |
| 6,573,548 B2 | | 6/2003 | Leung et al. | |
| 6,995,415 B2 | | 2/2006 | Ogawa et al. | |
| 7,414,278 B2 | | 8/2008 | Sugatani et al. | |
| 2002/0094697 A1 | * | 7/2002 | Leung et al. ............. | 438/766 |
| 2003/0001181 A1 | * | 1/2003 | Leung et al. ............. | 257/296 |
| 2004/0036051 A1 | * | 2/2004 | Sneh ..................... | 251/301 |
| 2004/0124477 A1 | * | 7/2004 | Minami et al. ............ | 257/379 |
| 2004/0137667 A1 | * | 7/2004 | Ogawa et al. ............. | 438/142 |
| 2005/0098905 A1 | * | 5/2005 | Lee et al. ................ | 257/903 |
| 2005/0189609 A1 | * | 9/2005 | Tu ....................... | 257/510 |

FOREIGN PATENT DOCUMENTS

| | | |
|---|---|---|
| JP | 2004-172643 | 6/2004 |
| JP | 2004-527901 A | 9/2004 |
| JP | 2004-311853 A | 11/2004 |
| JP | 2006-049413 | 2/2006 |

OTHER PUBLICATIONS

Japanese Office Action, w/ English translation thereof, issued in Japanese Patent Application No. JP 2004-379735 dated Mar. 9, 2010.

* cited by examiner

*Primary Examiner* — Bradley K Smith
(74) *Attorney, Agent, or Firm* — McDermott Will & Emery LLP

(57) ABSTRACT

A semiconductor storage device is provided, which inhibits shorts between cells to improve operational reliability and contributes to high-speed operation. An active region (7) where DRAM cells are formed is defined by an isolation trench (40) formed in a silicon substrate (1). The isolation trench (40) has an isolation insulating film (4) formed therein. Each DRAM cell includes a MOS transistor having a gate electrode (12) with sidewalls (13), and a capacitor having an upper electrode (22) with sidewalls (23). A recess (41) is formed in the upper portion of the isolation trench (40), and the upper electrode (22) of the capacitor has a buried portion buried in the recess (41). The outer edge ($E_1$) of the buried portion of the upper electrode (22) is located inside the outer edge ($E_2$) of the sidewalls (23).

9 Claims, 14 Drawing Sheets

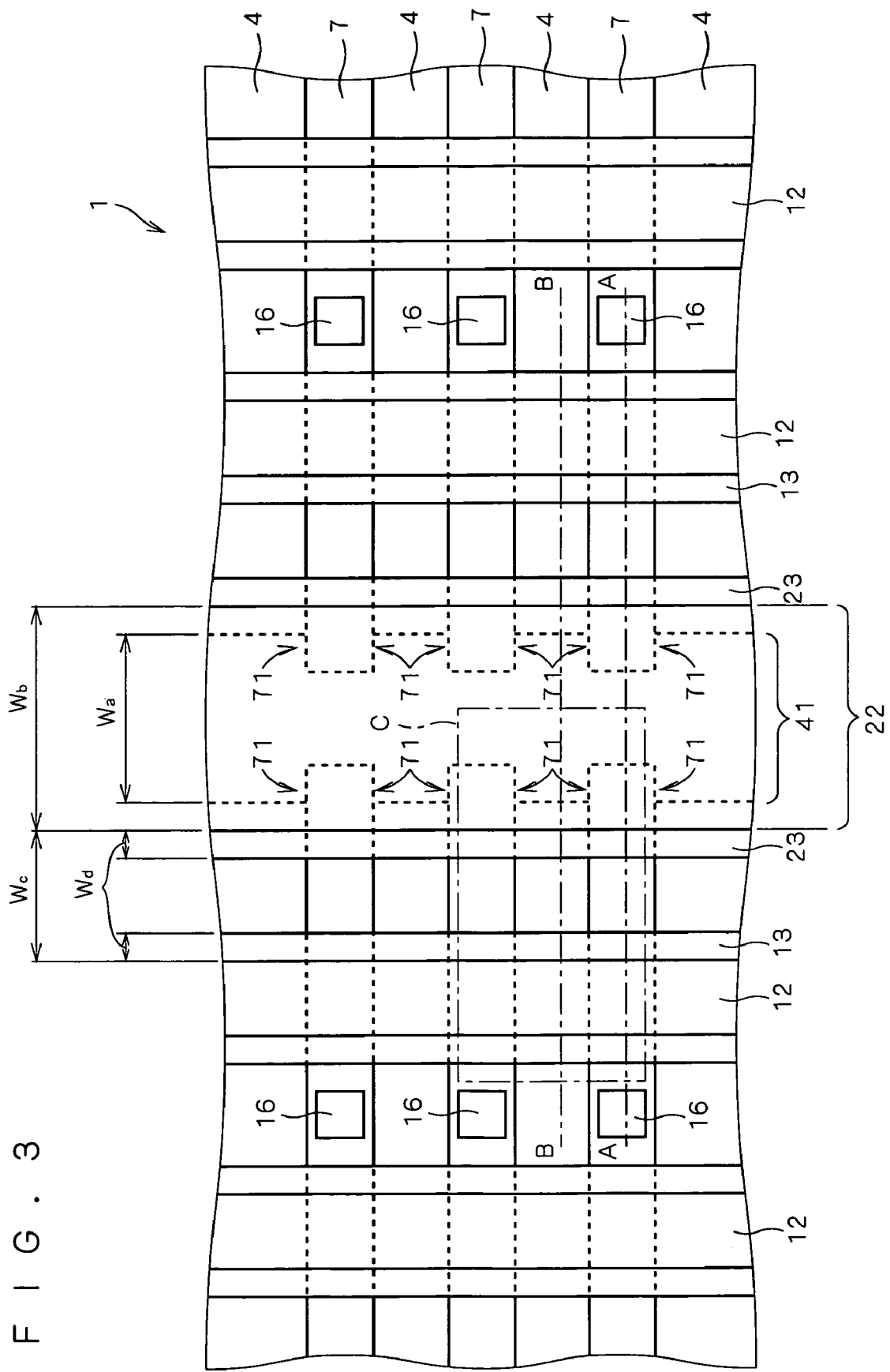

F I G. 1 1 A
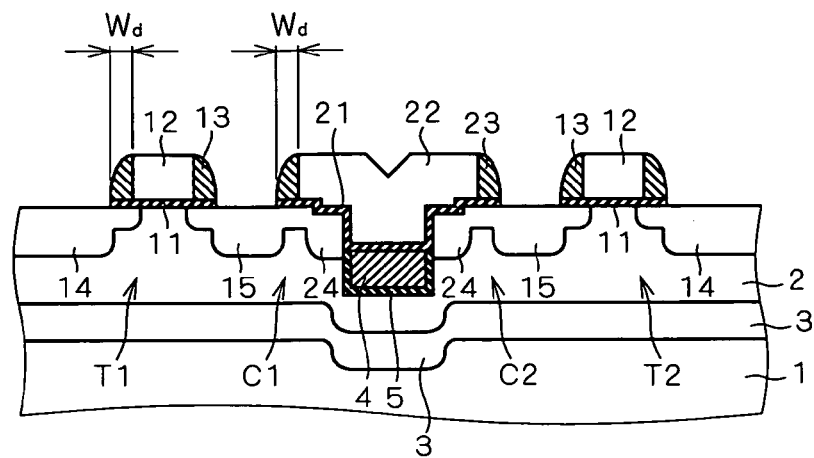
F I G. 1 1 B
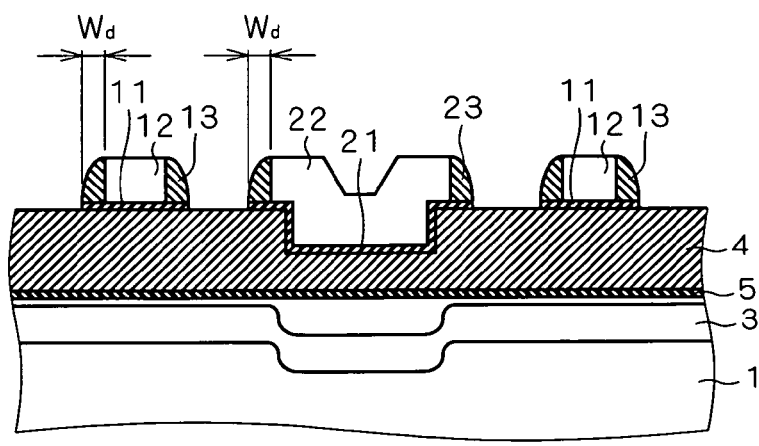
F I G. 1 1 C
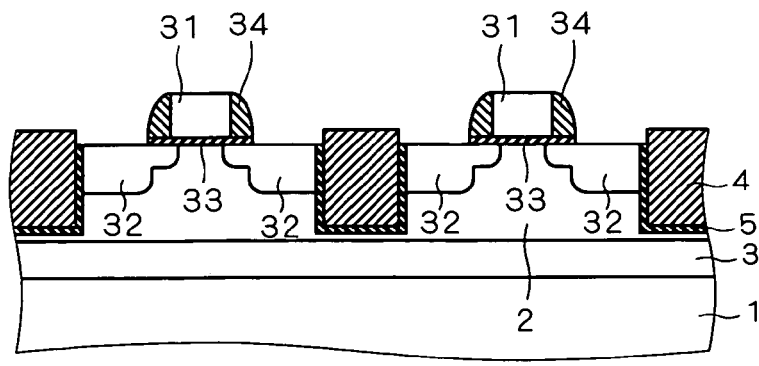

SEMICONDUCTOR STORAGE DEVICE

BACKGROUND OF THE INVENTION

1. Field of the Invention

The present invention relates to a semiconductor storage device with capacitors, such as DRAM (Dynamic Random Access Memory).

2. Description of the Background Art

One of well-known conventional semiconductor storage devices is a DRAM cell that is composed of a MOS (Metal-Oxide Semiconductor) transistor and a capacitor having a lower electrode of impurity diffusion layer connected to a source/drain region of the MOS transistor (as disclosed for example in Japanese Patent Application Laid-open Nos. 2004-527901 and 2004-311853). A DRAM cell disclosed in Japanese Patent Application Laid-open No. 2004-527901 includes an isolation insulating film (field dielectric layer) formed in the upper surface of a semiconductor substrate and having a recess (cavity) formed in its upper portion. The recess exposes the sidewall of the semiconductor substrate. The capacitor of the DRAM cell extends to the exposed sidewall in the recess, thereby increasing its effective area and accordingly its capacity.

The DRAM cell disclosed in Japanese Patent Application Laid-open No. 2004-527901 has thick sidewalls on the side surfaces of a gate electrode of the MOS transistor and on the side surfaces of an upper electrode of the capacitor, so that the upper portion of the source/drain region of the MOS transistor which is connected to the capacitor, is completely covered with those sidewalls. This prevents silicidation of the upper surface of that source/drain region to reduce resistance between the MOS transistor and the capacitor. It inhibits high-speed operation of the semiconductor storage device.

On the other hand, Japanese Patent Application Laid-open No. 2004-311853 discloses a DRAM cell structure in which sidewalls on the side surfaces of a gate electrode of a MOS transistor and sidewalls on the side surfaces of an upper electrode of a capacitor are spaced from each other, and a silicide layer is formed on source/drain regions of the MOS transistor to reduce resistance.

However, the DRAM cell disclosed in Japanese Patent Application Laid-open No. 2004-311853 has a possibility that polysilicon forming the upper electrode of the capacitor may be exposed between adjacent DRAM cells, depending on the width of a recess formed in an isolation insulating film and the widths of the upper electrode and its sidewalls of the capacitor (the detail of which will be described later (cf. FIGS. 14A, 14B and 15A, 15B). In that case, during the step of siliciding the upper portion of the source/drain regions of the MOS transistor, the exposed polysilicon and the upper portion of the source/drain regions may form an integral silicide layer. This will cause a short between the DRAM cells through the silicide layer, thereby decreasing the operational reliability of the semiconductor storage device.

SUMMARY OF THE INVENTION

It is an object of the present invention to provide a semiconductor storage device which inhibits short circuits between memory cells to improve operational reliability and contributes to high-speed operation.

According to the present invention, the semiconductor storage device includes: an active region defined by a trench formed in an upper portion of a semiconductor substrate; an element isolation insulating film formed in the trench; a MOS transistor formed in the active region; and a capacitor having a lower electrode which is an impurity diffusion layer connected to a source/drain region of the MOS transistor, a dielectric layer formed on a surface of the impurity diffusion layer, and an upper electrode formed on the dielectric layer. The element isolation insulating film has a recess which exposes an inner wall of the trench. The impurity diffusion layer and the dielectric layer extends from an upper surface of the active region along the inner wall of the trench which is exposed in the recess. The upper electrode has a buried portion buried in the recess and has a sidewall formed on a side surface of its portion which is not buried in the recess. An outer edge of the buried portion of the upper electrode is located inside an outer edge of the sidewall.

The buried portion of the upper electrode is completely covered with the portion of the upper electrode which is not buried in the recess or with the sidewall of that portion. Thus, the upper surface of the buried portion will not expose between DRAM cells. Accordingly, even if each electrode of the MOS transistor and the capacitor is silicided for high-speed operation, such a silicide layer that will cause shorts between cells will not be formed. This prevents decrease in operational reliability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a top view of a DRAM cell array according to the preferred embodiment of the present invention;

FIGS. 5A-5C, 6A-6C, 7A-7C, 8A-8C, 9A-9C, 10A-10C, 11A-11C, and 12A-12C are schematic views showing the steps in a method of manufacturing a DRAM cell according to the preferred embodiment of the present invention;

DESCRIPTION OF THE PREFERRED EMBODIMENTS

Figure 1:
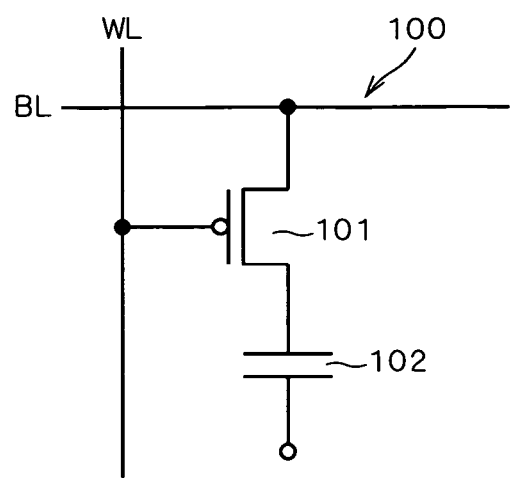
FIG. 1 is a circuit diagram of a common DRAM cell.

FIG. 1 is a circuit diagram of a common DRAM cell. A DRAM cell 100 is composed of a PMOS transistor 101 which is an access transistor for data writing, refreshing, reading, and the like; and a capacitor 102 which accumulates charge according to data. The PMOS transistor 101 has a gate terminal connected to a word line WL and source/drain terminals, one of which is connected to a bit line BL and the other of which is connected to one terminal of the capacitor 102. The other terminal of the capacitor 102 is connected to a predetermined power supply.

Figure 2A:
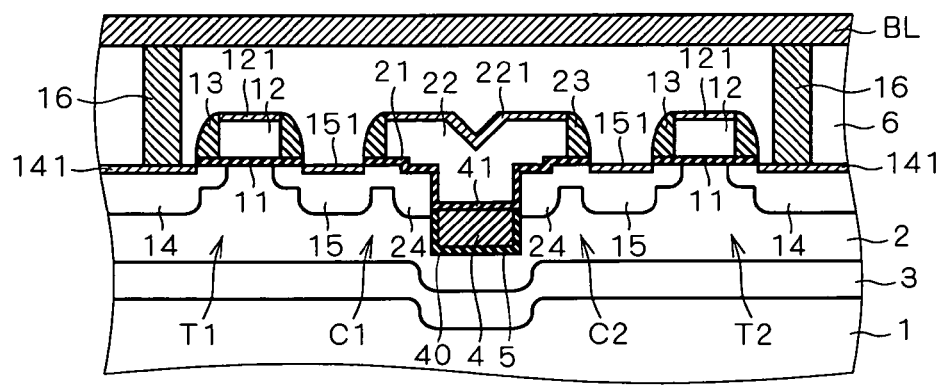
FIGS. 2A and 2B are cross-sectional views of DRAM cells in a semiconductor storage device according to a preferred embodiment of the present invention.

FIG. 2A is a cross-sectional view of DRAM cells in a semiconductor storage device according to a preferred embodiment of the present invention. This figure shows two cells in a DRAM cell array, which are adjacent to each other in a direction of extension of bits lines BL. More specifically, a DRAM cell composed of a PMOS transistor T1 and a capacitor C1 is shown on the left side of FIG. 2A, and another DRAM cell composed of a PMOS transistor T2 and a capacitor C2 is shown on the right side.

In this preferred embodiment, the DRAM cells are formed in a P-type silicon substrate 1. And, an N well 2 is formed in an area where the PMOS transistors T1 and T2 and the capacitors C1 and C2 forming the DRAM cells are formed. Between the two cells shown in FIG. 2A, an isolation trench 40 is formed, in which an isolation insulating film 4 or STI (shallow trench isolation) is formed. The isolation insulating film 4 is a high-density plasma oxide film, and an oxide film 5 which is a thin thermal oxide film is interposed between the isolation insulating film 4 and the silicon substrate 1. Further, a channel cut layer 3 is formed in the N well 2 at depths in the neighborhood around the bottom of the isolation insulating film 4.

The PMOS transistors T1 and T2 each consist of a gate oxide film 11, a gate electrode 12 of polysilicon formed on the gate oxide film 11, sidewalls 13 formed on the side surfaces of the gate electrode 12, and source/drain regions 14 and 15 formed in the surface of the silicon substrate 1 on both sides of the gate electrode 12. On the gate electrode 12 and the source/drain regions 14 and 15, silicide layers 121, 141, and 151 are formed, respectively. The source/drain region 14 is connected through the silicide layer 141 to a contact 16 which is connected to one of the bit lines BL on an interlayer insulation film 6.

As shown in FIG. 2A, the capacitors C1 and C2 share an upper electrode 22 and each have a p-type impurity diffusion layer (hereinafter referred to as the "lower diffusion layer") 24 which serves as a lower electrode, and an insulation film (hereinafter referred to as the "dielectric layer") 21 which serves as a dielectric layer between the upper electrode 22 and the lower diffusion layer 24. A silicide layer 221 is formed on the upper electrode 22. The p-type lower diffusion layer 24 is connected to the source/drain region 15 which is of the same p-type. That is, the lower diffusion layer 24 is electrically connected to the source/drain region 15, thereby serving as an electrode of the capacitor 102 which is connected to the source/drain terminal of the PMOS transistor 101.

While a conventional isolation insulating film is formed to completely fill in the isolation trench 40, the isolation insulating film 4 according to this preferred embodiment has a recess 41 formed under the upper electrode 22 to expose the sidewall of the isolation trench 40. Thus, in the cross-section shown in FIG. 2A, the isolation insulating film 4 is formed only in the bottom of the isolation trench 40. Corresponding to this, the lower diffusion layer 24 and the dielectric layer 21 are also formed along the inner wall of the isolation trench 40 (along the inner wall of the recess 41), and part of the upper electrode 22 is buried in the recess 41. In this structure, not only the upper surface of the silicon substrate 1 but also the sidewall of the isolation trench 40 can serve as the effective areas of the capacitors C1 and C2, thereby increasing the capacity of the capacitors C1 and C2.

Cells in the DRAM cell array are also arranged in a direction of extension of word lines WL. In this preferred embodiment, the gate electrodes 12 serve as the word lines WL and extend in a direction at right angles to the bit lines BL. FIG. 3 shows a top view of the DRAM cell array according to this preferred embodiment. In this figure, components identical to those shown in FIG. 2A are designated by the same reference numerals. FIG. 2A corresponds to a cross-section taken along line A-A of FIG. 3. As shown in FIG. 3, an active region 7 of the silicon substrate 1 where the DRAM cells are formed is defined by the isolation insulating film 4 (i.e., the isolation trench 40).

Figure 2B:
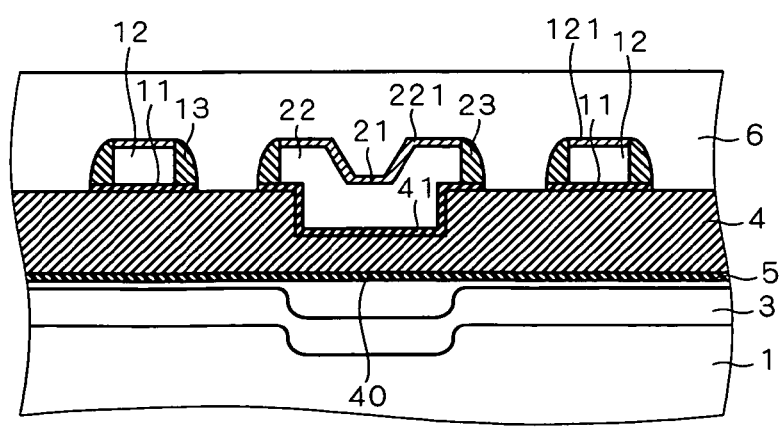

FIG. 2B is a cross-sectional view taken along line B-B of FIG. 3 and showing a cross-section of an element isolation region between adjacent DRAM cells in the direction of extension of the word lines WL (e.g., the gate electrodes 12) in the DRAM cell array according to this preferred embodiment. Also in this figure, components identical to those shown in FIG. 2A are designated by the same reference numerals.

As shown in FIG. 2B, also between adjacent DRAM cells in the direction of extension of the gate electrodes 12, the isolation insulating film 4 has the recess 41 formed under the upper electrode 22 to expose the sidewall of the isolation trench 40 (not shown in FIG. 2B and shown by 71 in FIG. 3). Corresponding to this, the lower diffusion layer 24 and the dielectric layer 21 are also formed along the inner wall of the isolation trench 40, and part of the upper electrode 22 is buried in the recess 41. Thus, the inner wall (shown by 71 in FIG. 3) of the isolation trench 40 can also serve as the effective areas of the capacitors C1 and C2, thereby further increasing the capacity of the capacitors C1 and C2.

Further in this preferred embodiment, as above described, the silicide layer 151 is formed on the source/drain region 15. This keeps low connection resistance between the access transistors (PMOS transistors T1 and T2) and the capacitors (C1 and C2), thereby contributing to high-speed operation of the DRAM cells.

Figure 4A:
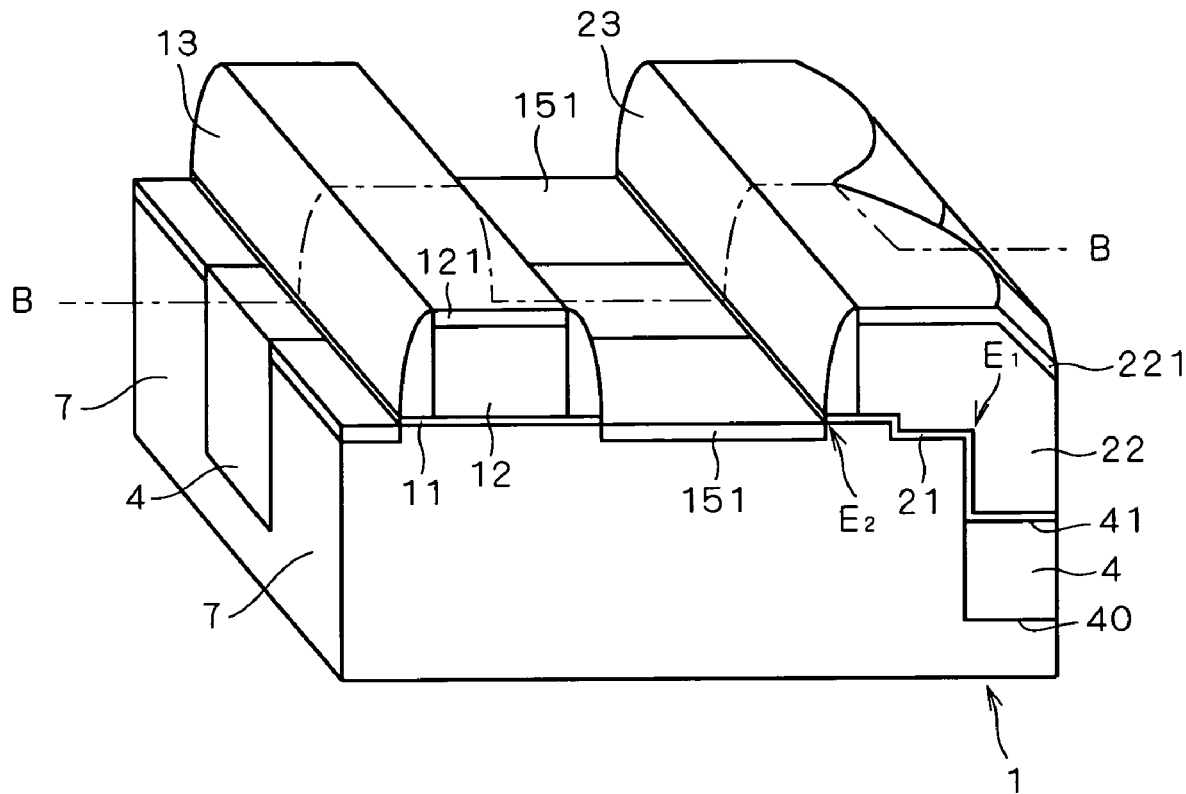
FIGS. 4A and 4B are perspective views showing a DRAM cell structure according to the preferred embodiment of the present invention.
Figure 4B:
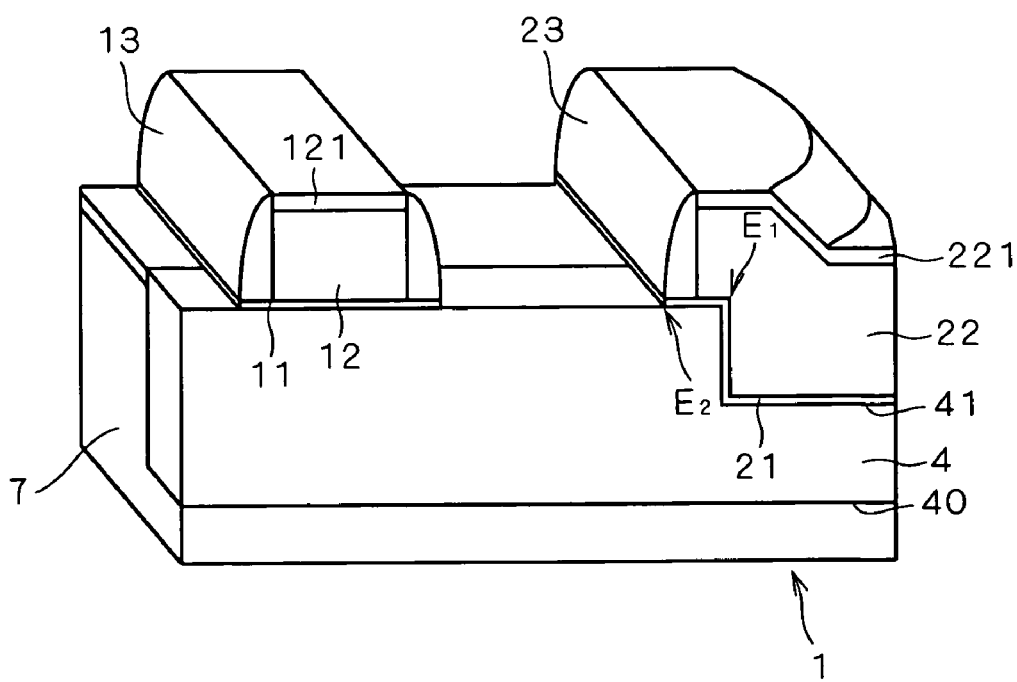

FIG. 4A is a perspective view showing the structure of a DRAM cell according to this preferred embodiment. This figure is an enlarged sectional view of a region C in FIG. 3. FIG. 4B is a perspective cross-sectional view taken along line B-B of FIGS. 3 and 4A. Also in these figures, components identical to those shown in FIGS. 2A, 2B, and 3 are designated by the same reference numerals. For the sake of simplicity, the source/drain regions 14 and 15, the lower diffusion layer 24, and the oxide film 5 are not shown in FIGS. 4A and 4B.

As shown in FIGS. 4A and 4B, the active region 7 where the DRAM cells are formed is defined by the isolation trench 40 in which the isolation insulating film 4 is buried, and the recess 41 which exposes the inner wall of the isolation trench 40 is formed in the upper portion of the isolation insulating film 4. The upper electrode 22 of the capacitors C1 and C2 has a portion (buried portion) which is buried in the recess 41 formed in the isolation insulating film 4. Further, sidewalls 23 are formed on the side surfaces of a portion of the upper electrode 22 which is not buried in the recess 41. A silicide layer 221 is formed on the upper electrode 22, and the silicide layer 151 is formed on the source/drain region 15 (not shown in FIGS. 4A and 4B) between the gate electrode 12 and the upper electrode 22.

As previously described, the DRAM cell with the above structure has a possibility that part of the upper electrode 22 of polysilicon that is buried in the recess 41 may be exposed between adjacent DRAM cells according to the width of the recess 41 formed in the isolation insulating film 4 and the widths of the upper electrode 22 and its sidewalls 23. Also, the same phenomenon may occur depending on misalignment or size variations during the step of forming the recess 41 or the step of forming the upper electrode 22 in the manufacture of the DRAM cells. In that case, exposed polysilicon between the cells and the silicide layer 151 may form an integral silicide layer during the step of siliciding the source/drain regions 15 of the PMOS transistors T1 and T2, thereby causing a short between the cells.

This will be described with reference to FIGS. 14A, 14B and 15A, 15B. Those figures correspond to FIGS. 2A, 2B and 4A, 4B, respectively (the interlayer insulation film 6, the contacts 16, and the bit line BL are not shown in FIGS. 14A and 14B).

Figure 14A:
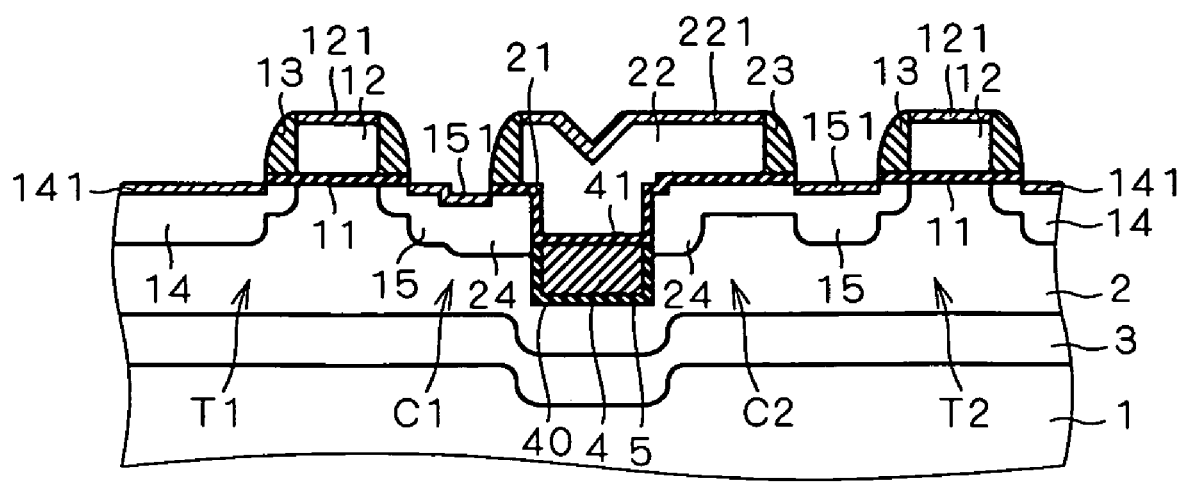
FIGS. 14A, 14B and 15A, 15B are diagrams for explaining a problem of conventional DRAM cells.
Figure 14B:
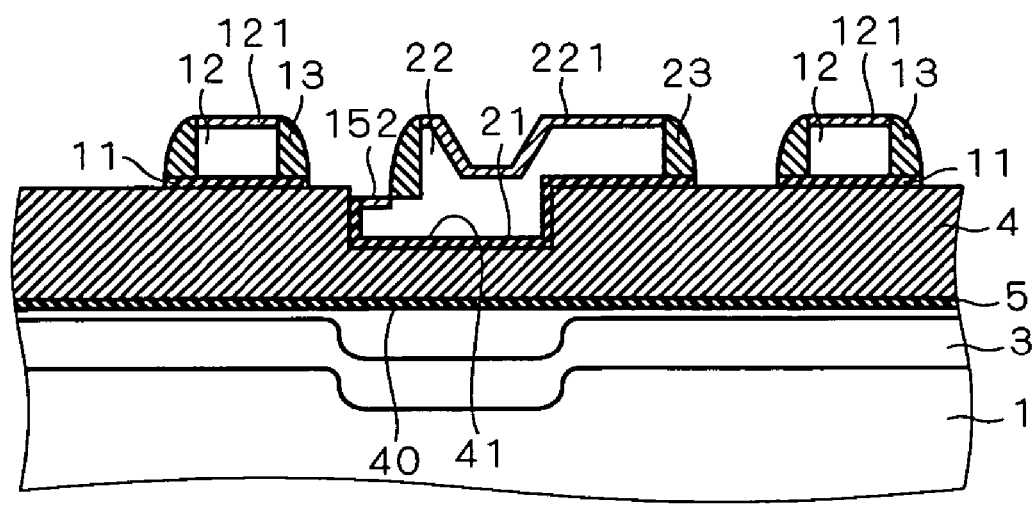
Figure 15A:
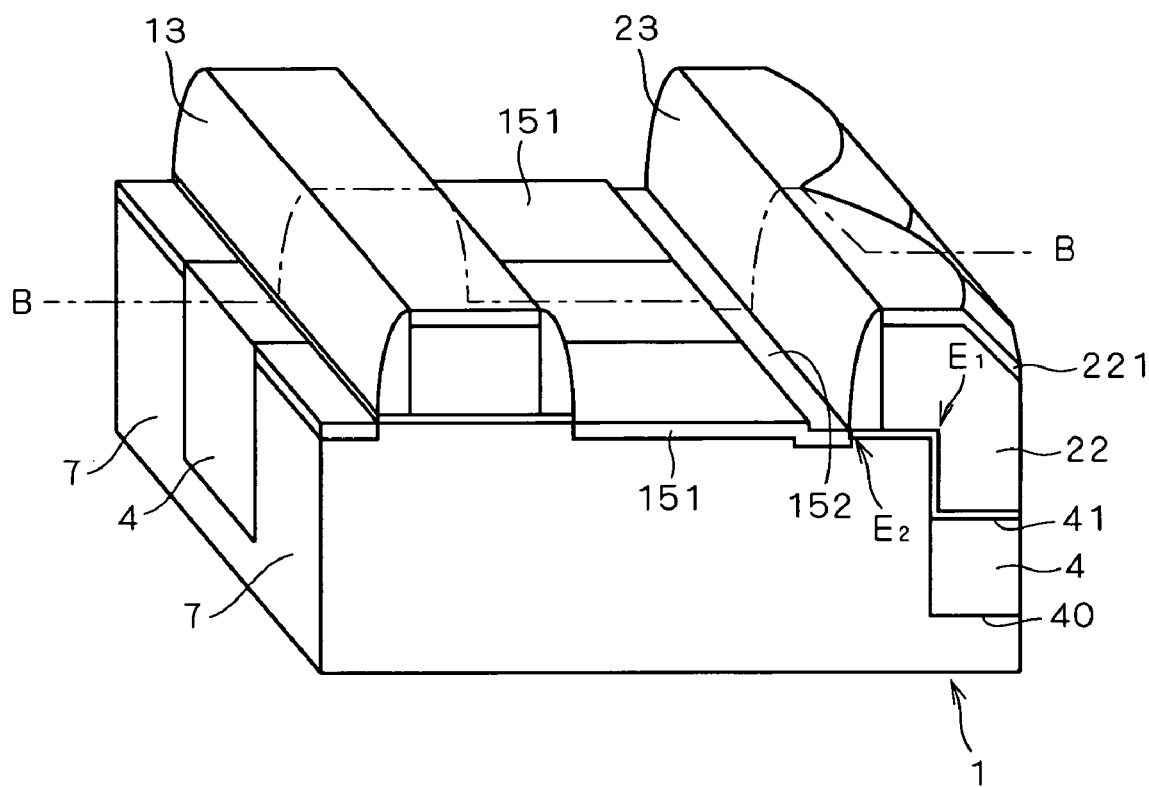
Figure 15B:
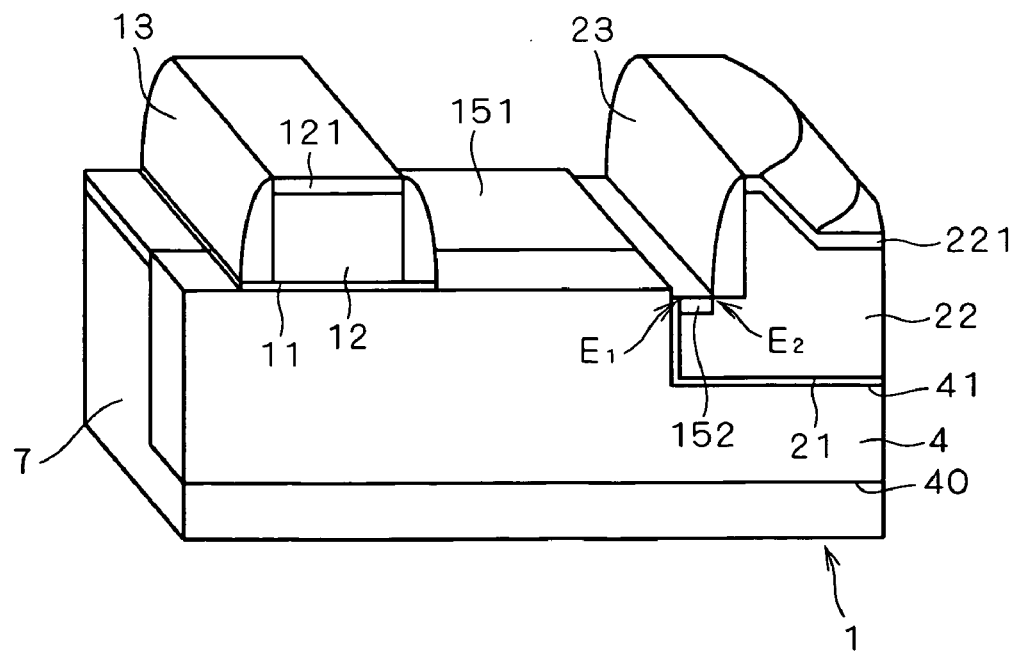

For example, if a mask pattern in the step of forming the recess 41 is misaligned to the left, and a mask pattern in the step of forming the gate electrode 12 and the upper electrode 22 is misaligned to the right, the structure becomes as shown in FIGS. 14A, 14B and 15A, 15B. More specifically, as shown in FIGS. 14B and 15B, the upper electrode 22 and the recess 41 are significantly misaligned so that the upper surface of the buried portion of the upper electrode 22 which is buried in the recess 41 are exposed between the sidewall 23 and the sidewall 13. In this case, as shown in FIG. 15B, an edge $E_1$ of the buried portion of the upper electrode 22 is located outside an outer edge $E_2$ of the sidewall 23 of the upper electrode 22.

This exposed portion of the upper electrode 22 will be silicided during the step of forming the silicide layer 151, thereby forming a silicide layer 152. At this time, the silicide layer 152 will be formed integrally with the silicide layer 151 as shown in FIG. 15A. Consequently, a short will be caused between the DRAM cells through the silicide layer 152.

Thus, this preferred embodiment provides a layout that prevents polysilicon forming the upper electrode 22 from being exposed on the upper surface of the isolation insulating film 4 between adjacent DRAM cells in the direction of extension of the gate electrodes 12. More specifically, in this preferred embodiment, as shown in FIGS. 4A and 4B, the edge $E_1$ of the buried portion of the upper electrode 22 is located inside the outer edge $E_2$ of the sidewalls 23. In other words, the edge of the recess 41 in the isolation insulating film 4 is covered with at least either the upper electrode 22 or the sidewalls 23.

The above structure can be a workaround to the above problem because polysilicon forming the buried portion of the upper electrode 22 is not exposed on the upper surface between adjacent DRAM cells. This inhibits shorts between DRAM cells to improve operational reliability as well as allows the formation of the silicide layer 151 on the source/drain region 15, thereby contributing to high-speed operation of the semiconductor storage device.

More preferably, the recess 41 should be entirely covered with only the upper electrode 22. Such a structure keeps a reduction in the effective areas of the capacitors C1 and C2 as minimum as possible and prevents deterioration in flatness caused by part of the sidewalls 23 incorporated into the recess 41.

Next, a method of manufacturing the semiconductor storage device according to this preferred embodiment will be described. FIGS. 5A-5C, 6A-6C, 7A-7C, 8A-8C, 9A-9C, 10A-10C, 11A-11C, 12A-12C, and 13A-13C are schematic views for explaining the manufacturing method. FIGS. 5A, 6A, 7A, 8A, 9A, 10A, 11A, 12A, and 13A show cross-sections taken along line A-A of FIG. 3, and FIGS. 5B, 6B, 7B, 8B, 9B, 10B, 11B, 12B, and 13B show cross-sections taken along line B-B of FIG. 3. FIGS. 5C, 6C, 7C, 8C, 9C, 10C, 11C, 12C, and 13C show cross-sections of peripheral circuits (not shown in FIG. 3) such as a logic unit of the semiconductor storage device.

Figure 5A:
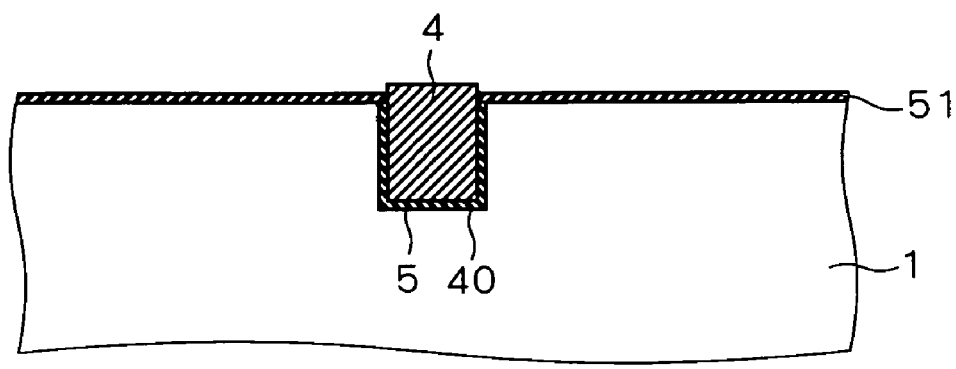
Figure 5B:
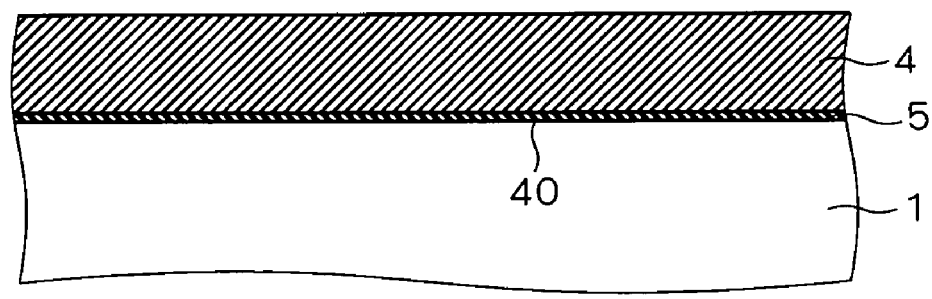
Figure 5C:
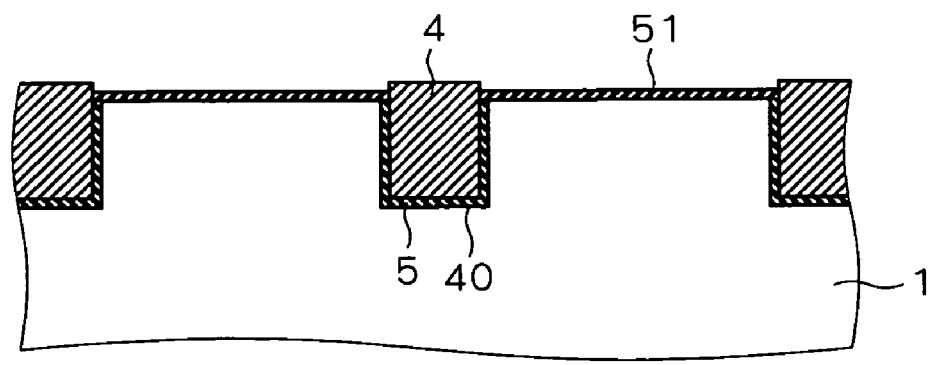

First, as shown in FIGS. 5A to 5C, the isolation trench 40 is formed in a DRAM cell region and a peripheral circuit region of the silicon substrate 1, and the oxide film 5 and the isolation insulating film 4 are formed in the isolation trench 40. More specifically, the procedure is as follows. The upper surface of the silicon substrate 1 is thermally oxidized to form an oxide film 51, on which then a silicon nitride film is formed. The silicon nitride film is opened in a pattern of the isolation trench 40, and the oxide film 51 and the upper portion of the silicon substrate 1 are etched using the opened silicon nitride film as a mask, thereby to form the isolation trench 40. Then, the oxide film 5 is formed by thermal oxidation on the inner wall of the isolation trench 40, and a high-density plasma oxide film fills in the isolation trench 40. Then, redundant parts of the high-density plasma oxide film on the upper surface of the silicon substrate 1 is removed by CMP to form the isolation insulating film 4 in the isolation trench 40, and the silicon nitride film is removed. This produces the structure shown in FIG. 5A to 5C.

Figure 6A:
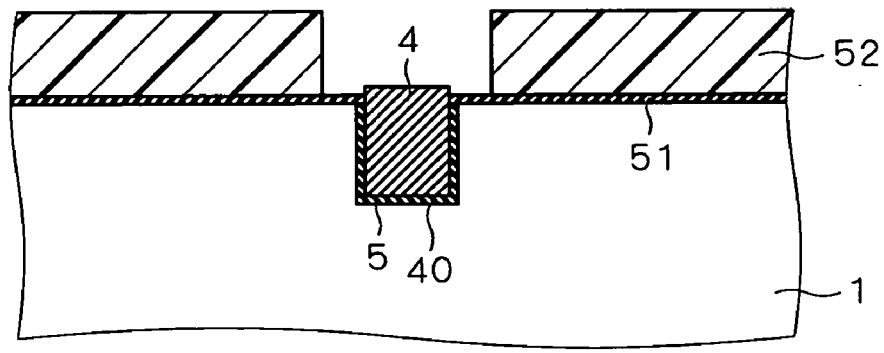
Figure 6B:
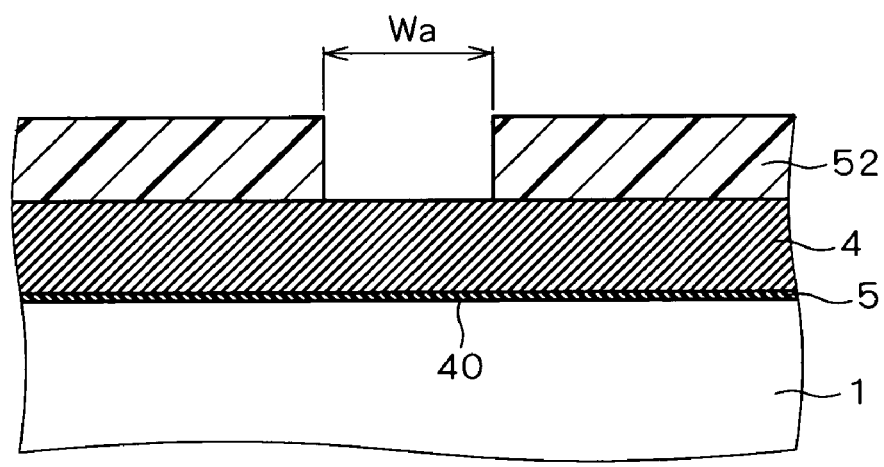
Figure 6C:
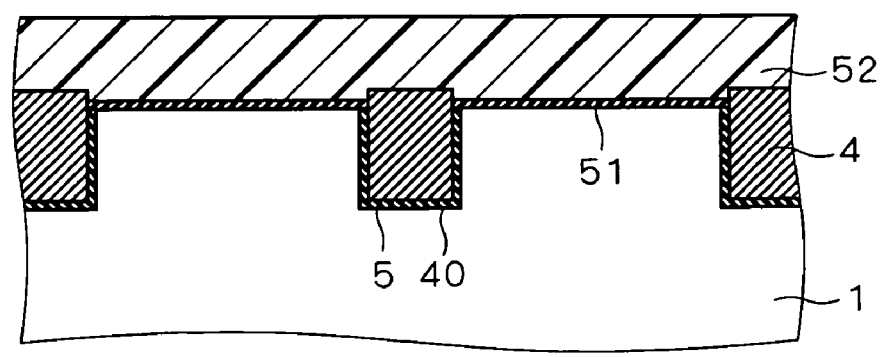
Figure 7A:
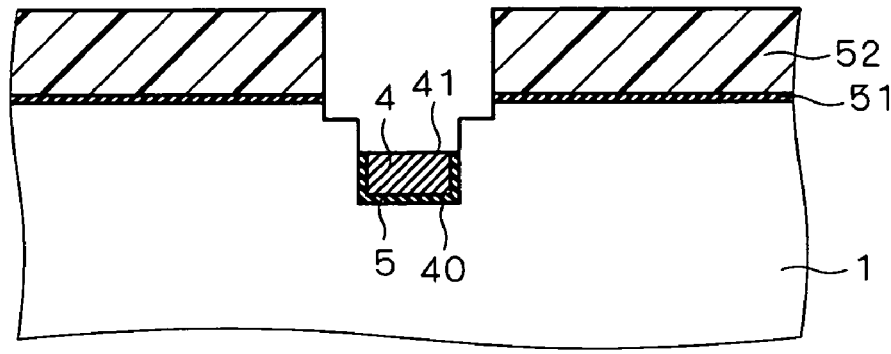
Figure 7B:
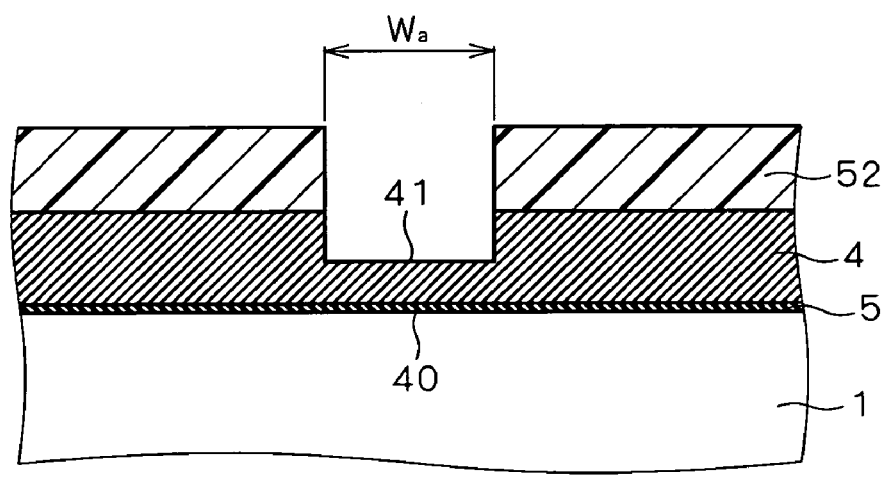
Figure 7C:
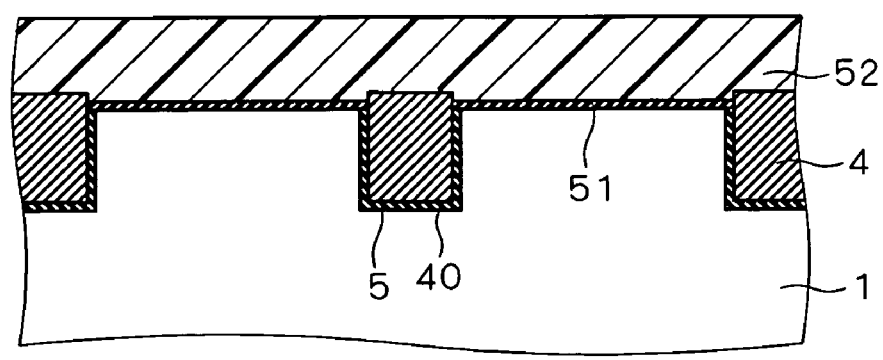

Then, as shown in FIGS. 6A to 6C, a resist mask 52 is formed, which has an opening formed in a pattern of the recess 41. By dry etching using the resist mask 52 as a mask, the upper portions of the isolation insulating film 4 and the oxide film 5 are removed to form the recess 41 (FIGS. 7A to 7C). While, in the cross-section shown in FIG. 7A, the opening of the resist mask 52 is greater in width than the isolation trench 40, an etching technique which ensures etching selectivity between the silicon substrate 1, and the isolation insulating film 4 and the oxide film 5 is used, so that only the upper portions of the isolation insulating film 4 and the oxide film 5 are removed. The depth of the recess 41 at this time should desirably be approximately half that of the isolation trench 40. Although the effective areas of the capacitors C1 and C2 increase with increasing depth of the recess 41, too deep a recess will cause the capacitors C1 and C2 to form a parasitic MOS transistor, thereby causing charge leakage between adjacent cells. Thus, the recess 41 has a width of $W_a$ as shown in FIG. 7B.

Figure 8A:
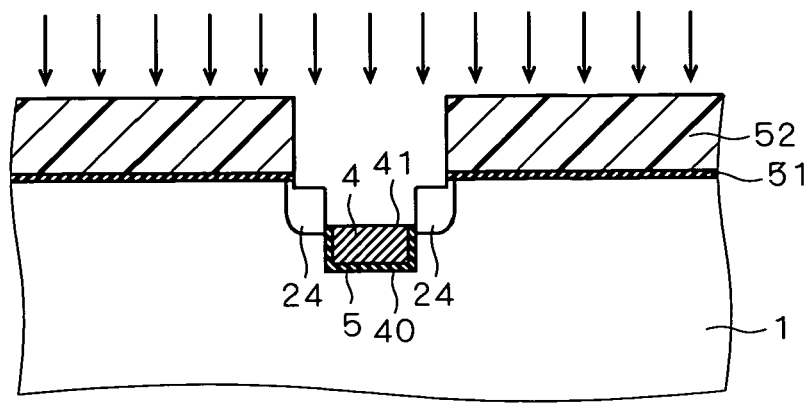
Figure 8B:
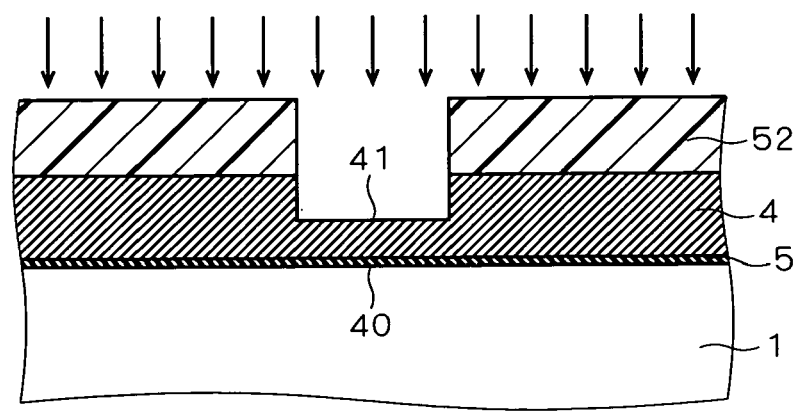
Figure 8C:
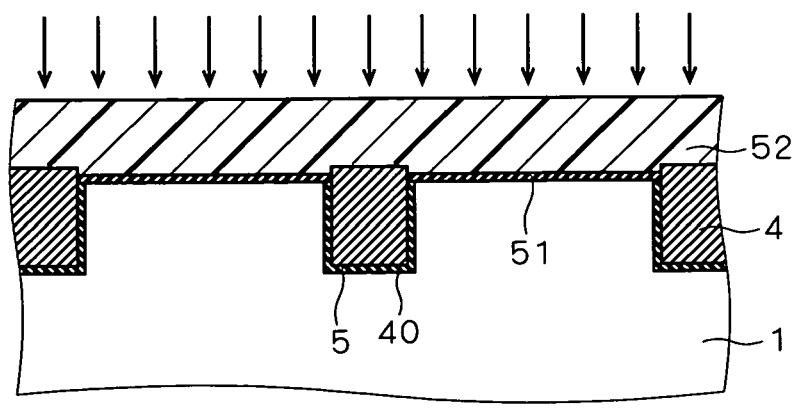

Then, using the resist mask 52 as a mask, p-type ions are implanted into the silicon substrate 1 (FIGS. 8A to 8C). Since, in the cross-section shown in FIG. 8A, the opening of the resist mask 52 is greater in width than the isolation trench 40, the p-type ions are implanted into the inner wall of the isolation trench 40 that is exposed in the recess 41. In this way, the lower diffusion layer 24 of high density (approximately $10^{20}/cm^3$) is formed along the inner wall of the isolation trench 40.

Figure 9A:
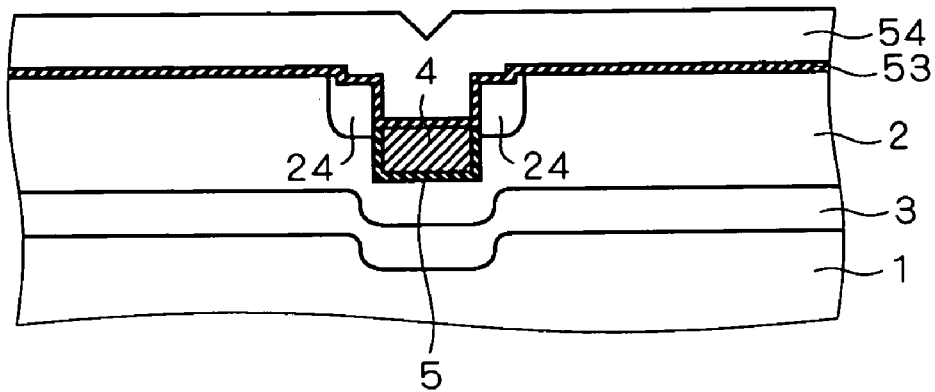
Figure 9B:
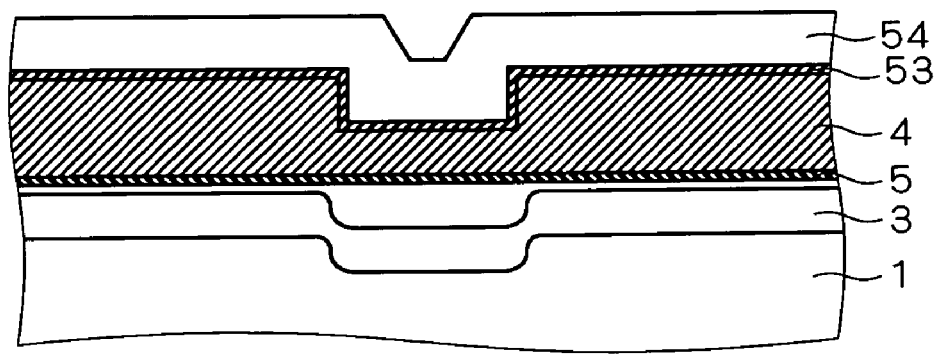
Figure 9C:
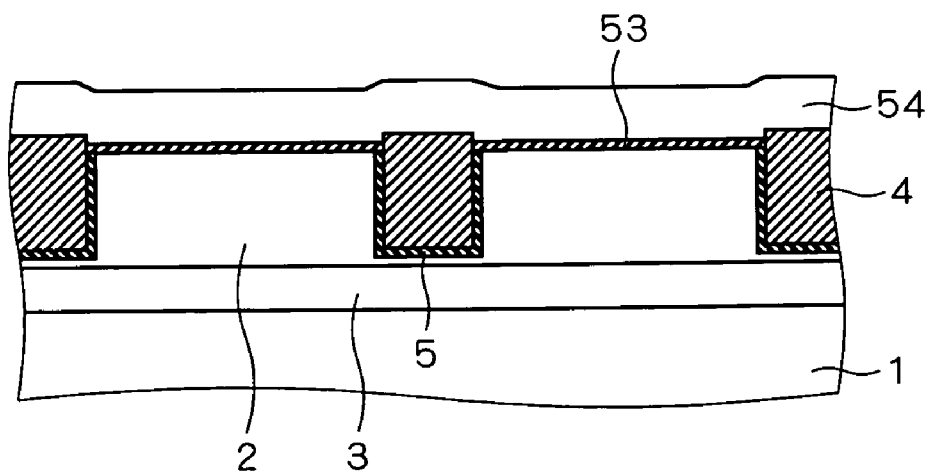

After the resist mask 52 and the oxide film 51 are removed to form a sacrificial oxide film (not shown) on the surface of the silicon substrate 1, ion implantation is performed to form the N well 2 and the channel cut layer 3, and to dope the channel in order to control the threshold values of the PMOS transistors T1 and T2 and transistors in peripheral circuits (hereinafter referred to as "peripheral transistors"). Then, after removal of the sacrificial oxide film, as shown in FIGS. 9A to 9C, an oxide film 53 and a polysilicon film 54 are formed on the surface of the silicon substrate 1. The above ion implantation may be performed after the formation of the polysilicon film 54.

Figure 10A:
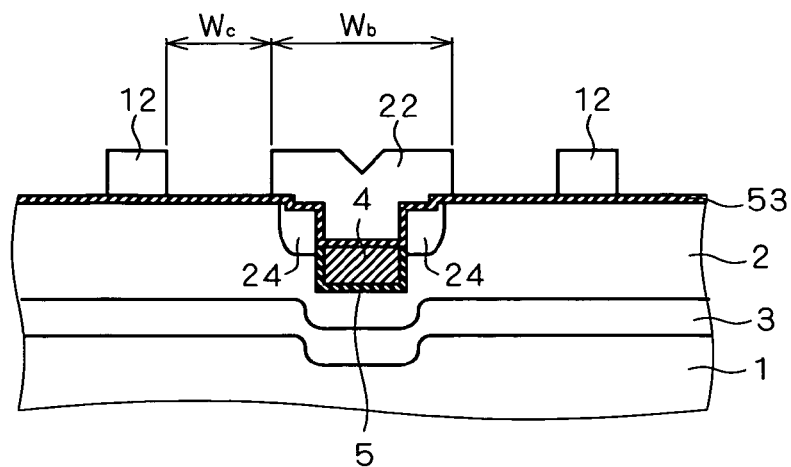
Figure 10B:
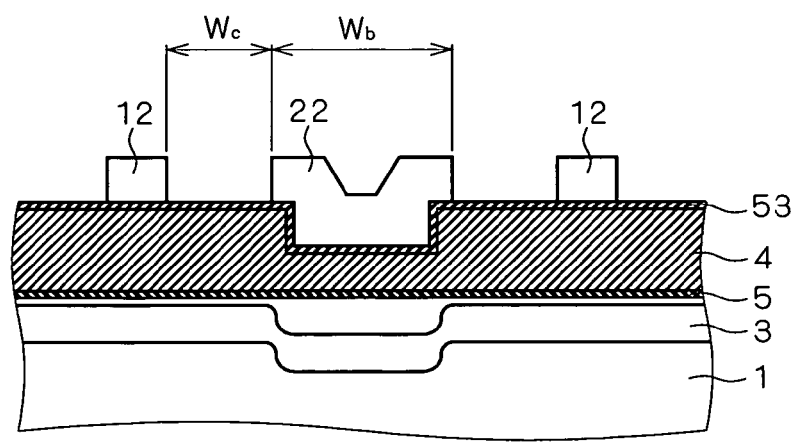
Figure 10C:
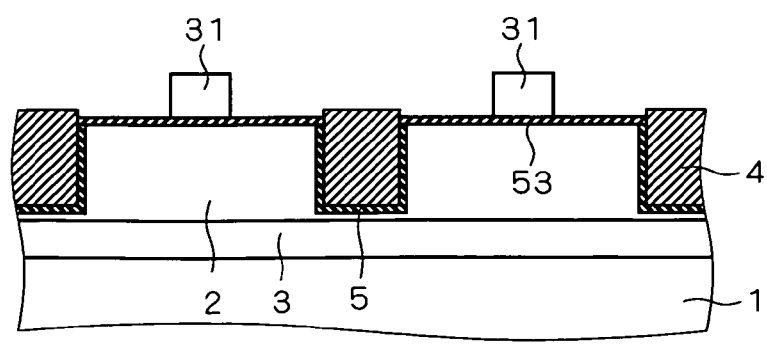

Then, a resist mask having a predetermined pattern is formed on the polysilicon film 54 and used as a mask in etching in order to pattern the polysilicon film 54 to form the gate electrodes 12, the upper electrode 22, and the gate electrodes 31 of the peripheral transistors (FIGS. 10A to 10C). Here, as shown in FIGS. 10A and 10B, the width of the upper electrode 22 shall be $W_b$, and the spacing between each of the gate electrodes 12 and the upper electrode 22 shall be $W_c$.

Then, LDD layers of the PMOS transistors T1 and T2 and the peripheral transistors are formed by ion implantation using the gate electrodes 12, the upper electrode 22, and the gate electrodes 31 of the peripheral transistors as masks. After that, a silicon nitride film is deposited over the entire surface and etched back to form the sidewalls 13, 23, and 34 on the side surfaces of the gate electrodes 12, the upper electrode 22, and the gate electrodes 31 of the peripheral transistors, respectively. Along with this, the oxide film 53 is also patterned to form the gate oxide films 11 of the PMOS transistors T1 and T2, the dielectric layer 21 of the capacitors C1 and C2, and gate oxide films 33 of the peripheral transistors. Further ion implantation forms the source/drain regions 14 and 15 of the PMOS transistors T1 and T2, and source/drain regions 32 of the peripheral transistors (FIGS. 11A to 11C). Here, the widths of the sidewalls 13 and 23 shall be $W_d$.

Figure 12A:
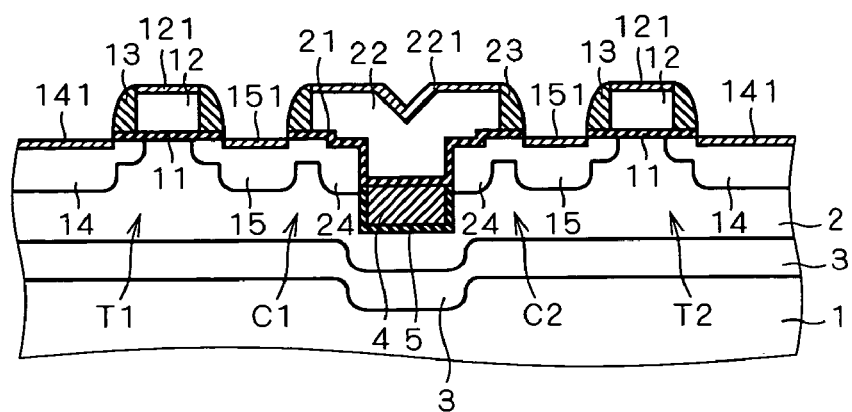
Figure 12B:
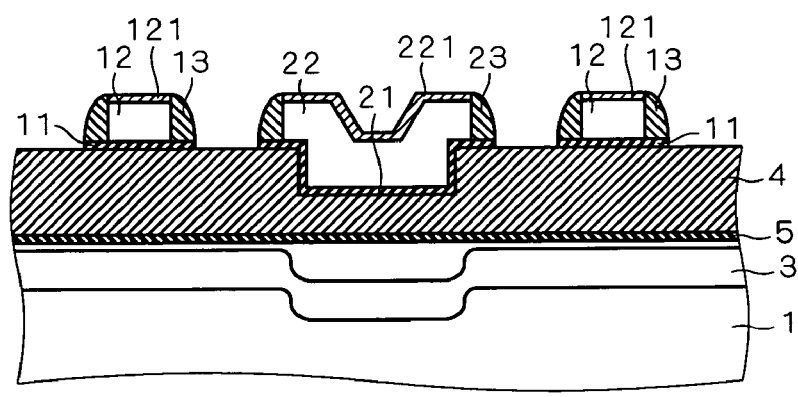
Figure 12C:
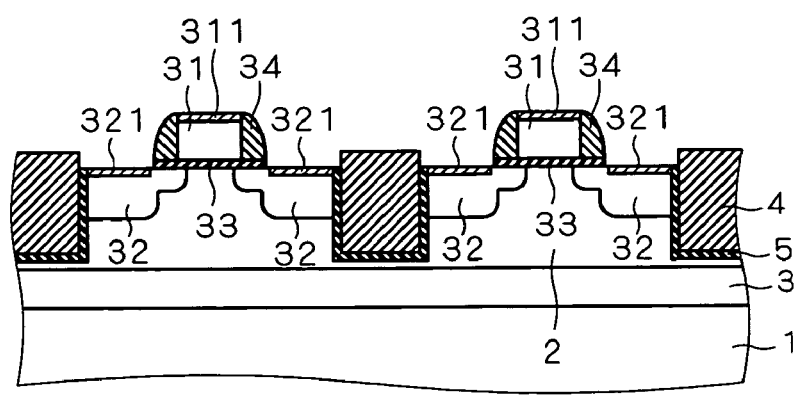

Thereafter, a metal film such as cobalt is formed over the entire surface of a region forming silicide and processed by heat treatment to remove an unreacted portion of the metal film. Thereby, the silicide layers 121, 141, 151, 221, 311, and 321 are formed in a self-aligned manner in the DRAM cell region and in the peripheral circuit region (FIGS. 12A to 12C).

Figure 13A:
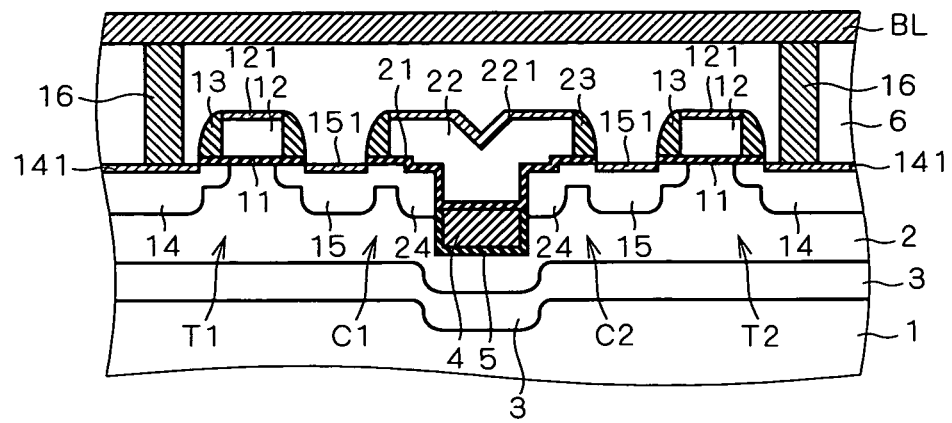
FIGS. 13A to 13C are schematic views for explaining the manufacturing method.
Figure 13B:
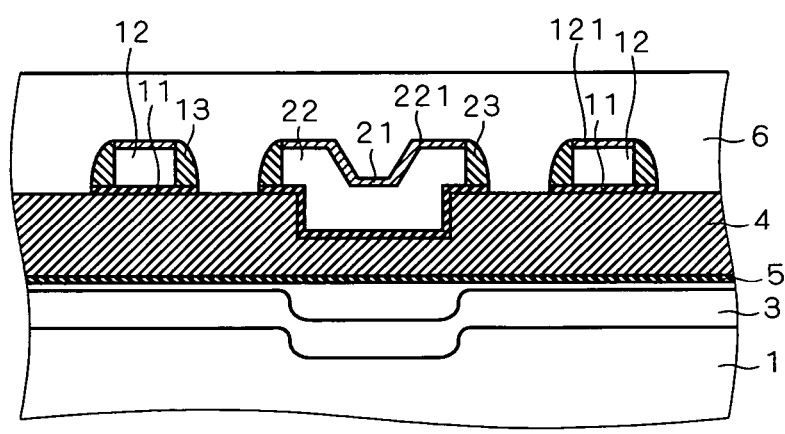
Figure 13C:
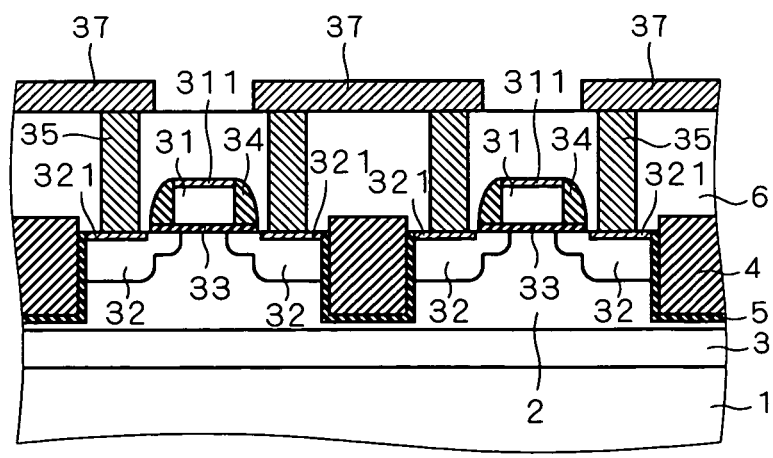

Then, the interlayer insulation film 6 is deposited with the contacts 16 and 35 formed therein, and the bit lines BL and interconnect lines 37 for the peripheral circuits are formed on the interlayer insulation film 6 (FIGS. 13A to 13C).

Through the aforementioned steps, the semiconductor storage device including peripheral circuits according to this preferred embodiment is produced. The sizes defined in the above description, namely the width $W_a$ of the recess 41, the width $W_b$ of the upper electrode 22, the spacing $W_c$ between the gate electrode 12 and the upper electrode 22, and the width $W_d$ of the sidewalls 13 and 23, are also shown in FIG. 3.

This preferred embodiment provides a layout that the edge $E_1$ of the buried portion of the upper electrode 22 is located inside the outer edge $E_2$ of the sidewall 23. To this end, if misalignment and size variations during the step of forming the recess 41, the gate electrodes 12, and the upper electrode 22 can be ignored, as can be seen from FIG. 3, the width $W_a$ of the recess 41, the width $W_b$ of the upper electrode 22, the spacing $W_c$ between the gate electrode 12 and the upper electrode 22, and the width $W_d$ of the sidewalls 13 and 23 should satisfy the following relation:

$$\frac{W_b}{2} + W_d - \frac{W_a}{2} > 0 \quad (1)$$

Let us suppose that the amount of misalignment of a mask pattern during the step of forming the recess 41 (FIGS. 6A-6C and 7A-7C), including variations, be $\sigma_1$, and variations in the width $W_a$ of the recess 41 be $\sigma_a$. Also, suppose that the amount of misalignment of a mask pattern during the step of forming the gate electrodes 12 and the upper electrode 22 (FIGS. 10A-10C), including variations, be $\sigma_2$; variations in the width $W_b$ of the upper electrode 22 be $\sigma_b$; variations in the spacing $W_c$ between the gate electrode 12 and the upper electrode 22 be $\sigma_c$; and variations in the width $W_d$ of the sidewalls 13 and 23 be $\sigma_d$.

In that case, in order for the above widths $W_a$, $W_b$, and $W_d$ in each formed DRAM cell to satisfy the above relation (1), design values (e.g., sizes in the mask pattern) $W_{a0}$, $W_{b0}$, and $W_{d0}$ of those widths $W_a$, $W_b$, $W_d$, respectively, should desirably be determined to satisfy the following relation:

$$\frac{W_{b0}}{2} + W_{d0} - \frac{W_{a0}}{2} > \sqrt{\sigma_1^2 + \sigma_2^2 + \sigma_a^2 + \sigma_b^2 + \sigma_d^2} \quad (2)$$

Further, since in this preferred embodiment, the silicide layer 151 is formed on the source/drain region 15, the source/drain region 15 needs to be exposed during the step of forming the silicide layer 151 (FIGS. 13A-13C). That is, the sidewalls 13 on the side surfaces of the gate electrode 12 and the sidewalls 23 on the side surfaces of the upper electrode 22 need to be spaced from each other. Accordingly, the spacing $W_c$ between the gate electrode 12 and the upper electrode 22, and the width $W_d$ of the sidewalls 13 and 23 should satisfy the following relation:

$$W_c - 2W_d > 0 \quad (3)$$

In that case, design values (e.g., sizes in the mask pattern) $W_{c0}$ and $W_{d0}$ of the spacing $W_c$ and the width $W_d$, respectively, should desirably be determined to satisfy the following relation:

$$W_{c0} - 2W_{d0} > \sigma_c + 2\sigma_d \quad (4)$$

By determining the design values $W_{a0}$, $W_{b0}$, $W_{c0}$, and $W_{d0}$ of the above values $W_a$, $W_b$, $W_c$, and $W_d$ in order to satisfy the above relations (2) and (4), the relations (1) and (3) can be reliably satisfied in each formed DRAM cell.

That is, it is possible to reliably form such a DRAM cell that the edge $E_1$ of the buried portion of the upper electrode 22 is located inside the outer edge $E_2$ of the sidewalls 23, and the silicide layer 151 is formed on the source/drain region 15. This inhibits shorts between cells to improve the operational reliability of the semiconductor storage device and reduces connection resistance between the access transistor and the capacitor in each DRAM cell, thereby contributing to high-speed operation of the semiconductor storage device.

While the invention has been shown and described in detail, the foregoing description is in all aspects illustrative and not restrictive. It is therefore understood that numerous modifications and variations can be devised without departing from the scope of the invention.

What is claimed is:

1. A semiconductor storage device comprising:
    an active region defined by a trench formed in an upper portion of a semiconductor substrate and where a memory cell is formed;
    an element isolation insulating film formed in said trench;
    a MOS transistor formed in said active region; and
    a capacitor having a lower electrode which is an impurity diffusion layer connected to a source or drain region of said MOS transistor, a dielectric layer formed on a surface of said impurity diffusion layer, and an upper electrode formed on said dielectric layer, wherein
    said element isolation insulating film having a recess therein between adjacent memory cells in an extended direction of a gate electrode of said MOS transistor which exposes an inner wall of said trench,
    said impurity diffusion layer and said dielectric layer extend from an upper surface of said active region along the inner wall of said trench which is exposed in said recess,
    said upper electrode has a first portion buried in said recess and a second portion which is not buried in said recess,
    said second portion extends closer to a gate electrode of said MOS transistor than said recess at an element isolation region between adjacent memory cells in the extended direction of said gate electrode in a cross-sectional view perpendicular to the extended direction of said gate electrode, and
    a step is formed in a portion of the lower electrode and dielectric layer underlying the second portion of the upper electrode.

2. The semiconductor storage device according to claim 1, wherein a silicide layer is formed on an upper surface of said source or drain region connected to said lower electrode, between said gate electrode and said upper electrode.

3. The semiconductor storage device according to claim 2, wherein a second silicide layer is formed on said upper electrode.

4. The semiconductor storage device according to claim 3, wherein said first silicide layer and said second silicide layer include a same metal.

5. The semiconductor storage device according to claim 1, wherein said dielectric layer and a gate oxide film of said MOS transistor are formed in the same process step.

6. The semiconductor storage device according to claim 1, further comprising:
a sidewall formed on a side surface of said upper electrode and on said dielectric layer.

7. A semiconductor storage device comprising:
an active region defined by a trench formed in an upper portion of a semiconductor substrate and where a memory cell is formed;
an element isolation insulating film formed in said trench;
a MOS transistor formed in said active region; and
a capacitor having a lower electrode which is an impurity diffusion layer connected to a source or drain region of said MOS transistor, a dielectric layer formed on a surface of said impurity diffusion layer, and an upper electrode formed on said dielectric layer, wherein
said element isolation insulating film having a recess therein between adjacent memory cells in an extended direction of a gate electrode of said MOS transistor which exposes an inner wall of said trench,
said impurity diffusion layer and said dielectric layer extend from an upper surface of said active region along the inner wall of said trench which is exposed in said recess,
said upper electrode has a first portion buried in said recess and a second portion which is not buried in said recess, and
an outer edge of said second portion near said gate electrode extends closer to said gate electrode than said recess at an element isolation region between adjacent memory cells in the extended direction of said gate electrode in a cross-sectional view perpendicular to the extended direction of said gate electrode, and
a step is formed in a portion of the lower electrode and dielectric layer underlying the second of the upper electrode.

8. The semiconductor storage device according to claim 7, wherein a first silicide layer is formed on an upper surface of said source or drain region connected to said lower electrode, between said gate electrode and said upper electrode.

9. The semiconductor storage device according to claim 7, further comprising:
a sidewall formed on a side surface of said upper electrode and on said dielectric layer.

* * * * *